United States Patent [19]

Yoshino

[11] Patent Number: 4,859,884
[45] Date of Patent: Aug. 22, 1989

[54] GATE SIGNAL GENERATOR FOR THYRISTOR VALVE

[75] Inventor: Teruo Yoshino, Tokyo, Japan

[73] Assignee: Kabushiki Kaisha Toshiba, Kawasaki, Japan

[21] Appl. No.: 216,538

[22] Filed: Jul. 8, 1988

[30] Foreign Application Priority Data

Jul. 10, 1987 [JP] Japan ............................. 62-172236

[51] Int. Cl.$^4$ ................. H03K 17/72; H03K 17/08
[52] U.S. Cl. ................................. 307/646; 307/643; 323/210; 363/54; H03K/17/72; H03K/17/08
[58] Field of Search ............... 307/646, 643, 645, 648; 323/210, 211; 363/54, 68, 87

[56] References Cited

U.S. PATENT DOCUMENTS

| | | | |
|---|---|---|---|
| 3,936,726 | 2/1976 | Kelley, Jr. | 307/646 |
| 4,260,948 | 4/1981 | Okado | 307/646 |
| 4,298,810 | 3/1981 | Dinger et al. | 307/646 |

FOREIGN PATENT DOCUMENTS

3015198 10/1980 Fed. Rep. of Germany .
3316402 11/1983 Fed. Rep. of Germany .
60-204230 10/1985 Japan .

Primary Examiner—John Zazworsky
Attorney, Agent, or Firm—Oblon, Spivak, McClelland, Maier Neustadt

[57] ABSTRACT

A gate signal generator comprises U- and X-phase set circuits for discriminating, after the conduction period of every cycle, whether OFF time intervals of U- and X-phase thyristors are greater or smaller than a predetermined value, a reset circuit for detecting that both the U- and X-phase circuits do not provide outputs, a flip-flop set in response to an output from the U- or X-phase set circuit and reset in response to an output from the reset circuit, AND gates for calculating AND products of an output from the flip-flop and U- and X-phase forward voltage signals and for outputting the signals at a start of the forward voltage application after setting the flip-flop, and OR gates for calculating OR sums of outputs from the AND gates and outputs from the normal gate circuits. Gate signals are applied to the thyristors in response to the outputs from the OR gates.

9 Claims, 7 Drawing Sheets

GATE SIGNAL GENERATOR FOR THYRISTOR VALVE

BACKGROUND OF THE INVENTION

1. Field of the Invention

The present invention relates to a gate signal generator for a thyristor valve used in a static var compensator (to be referred to as an SVC hereinafter).

2. Description of the Related Art

Figure 1:
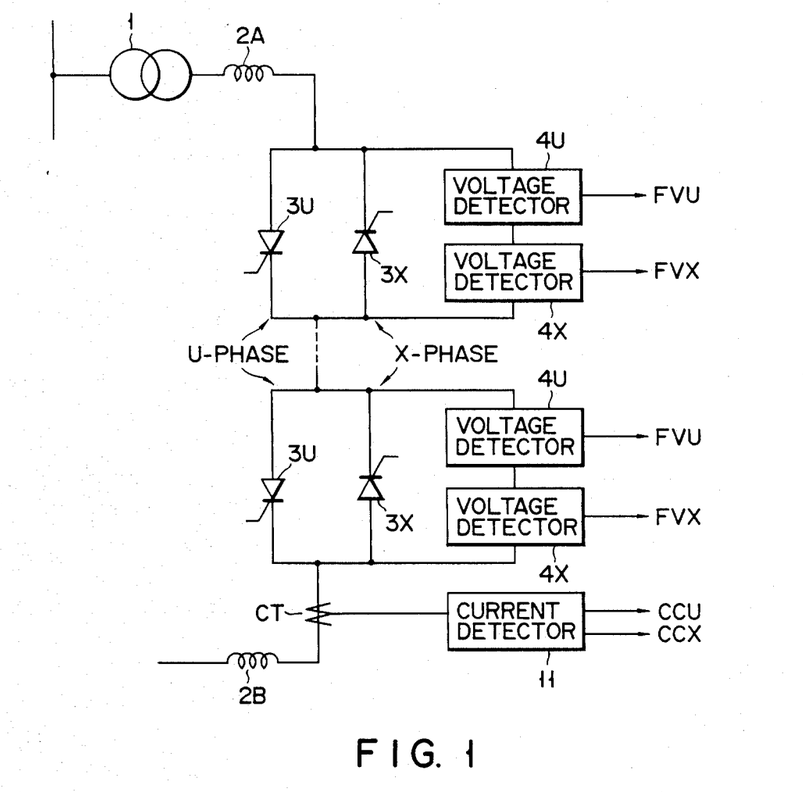
FIG. 1 is a block diagram showing a main part of a static var compensator having thyristor valves employed with a gate signal generator according to the present invention.

FIG. 1 shows an arrangement of the SVC for controlling a current flowing through a reactor, using thyristor valves each having a plurality of anti-parallel-connected thyristors as switching elements. Referring to FIG. 1, reference numeral 1 denotes a power transformer; 2A and 2B, reactors; 3U and 3X, thyristor valves; 4U and 4X, U- and X-phase forward voltage detectors for thyristor valves; CT, a current transformer for detecting a thyristor valve current; 11, a U-and X-phase current detector; and FVU and FVX, forward voltage signals.

Figure 2:
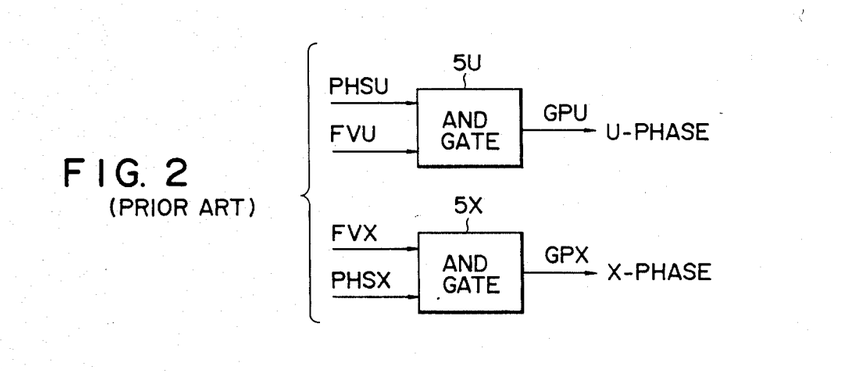
FIG. 2 is a block diagram showing a part of a conventional gate signal generator in which the present invention is not applied.
Figure 3:
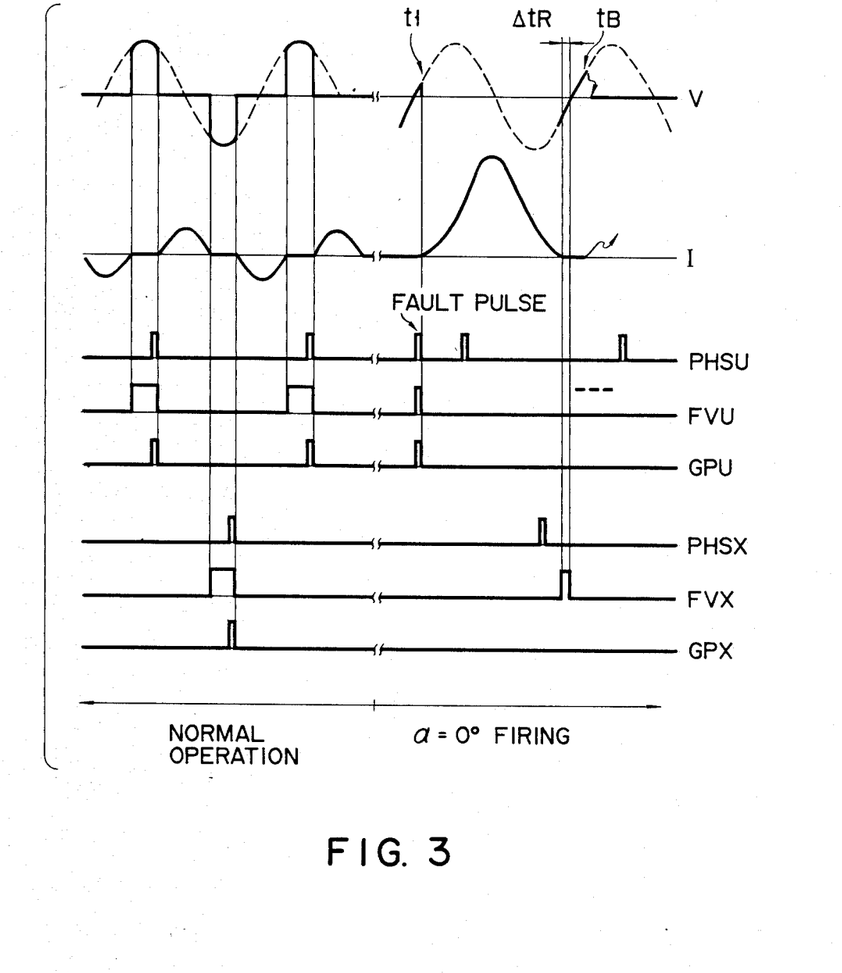
FIG. 3 is a timing chart for explaining the problems of the gate signal generator shown in FIG. 2.

FIG. 2 shows a conventional gate signal generator. Referring to FIG. 2, reference numerals 5U and 5X denote normal gate circuits each having an AND gate. The circuits generate gate signals GPU and GPX in accordance with logical AND signals of phase control signals PHSU and PHSX from an SVC controller (not shown) and forward voltage detection signals FVU and FVX from thyristor valves. FIG. 3 is a timing chart showing the signals from the above circuits and voltage waveform V across through the thyristor valves shown in FIG. 1.

In the conventional gate signal generator shown in FIG. 2, when the thyristor valve is fired near a zero-crossing point of the voltage across the thyristor valve terminals (to be referred to as $\alpha=0°$ firing hereinafter) due to an erroneous pulse, a noise pulse, or the like, the following problems are posed.

Referring to FIG. 3, when firing occurs $\alpha=0°$ and time t1 due to an erroneous pulse, a current including transient direct current components is caused to flow since the thyristor valves are connected in series with reactors. Resistive components of an electric power system including the reactors and the voltage transformer are much smaller than their reactive components. Therefore, a time interval $\Delta tR$, while a reverse voltage is applied to the thyristor valve after the current conduction, is small. When the reverse voltage time interval $\Delta tR$ is short, some thyristor elements are turned off and others are not turned off due to variations in the turn-off characteristics of respective elements. Since a plurality of thyristor elements are connected in series in order to obtain a high voltage rating thyristor valve, a forward voltage immediately after the reverse voltage time interval is applied only to the turned-off thyristor elements. Therefore, when a voltage higher than the withstand voltage is applied to the valve at time tB, the turned-off thyristor elements are broken down, thus possibly damaging the entire thyristor valve.

SUMMARY OF THE INVENTION

It is an object of the present invention to provide a gate signal generator which can eliminate the above disadvantages and properly fire a thyristor valve under any conditions.

In order to achieve the above object, the gate signal generator comprises U- and X-phase set circuits for discriminating whether OFF time intervals of U- and X-phase thyristor valves are greater than a predetermined value (about hundreds $\mu sec$) or smaller, after the conduction period of every cycle; a reset circuit for detecting that both the U- and X-phase set circuits do not provide outputs; a flip-flop which is set in response to an output from the U- or X-phase set circuit and is reset in response to an output from the reset circuit; AND gates for calculating logical AND products of an output from the flip-flop and U- and X-phase forward voltage signals and for outputting the signals at the beginning of the forward voltage application after setting the flip-flop; and OR gates for calculating logical OR sums of outputs from the AND gates and those from normal gate circuits, wherein the gate signals are applied to the thyristor valves in response to the outputs from the OR gates.

Figure 4:
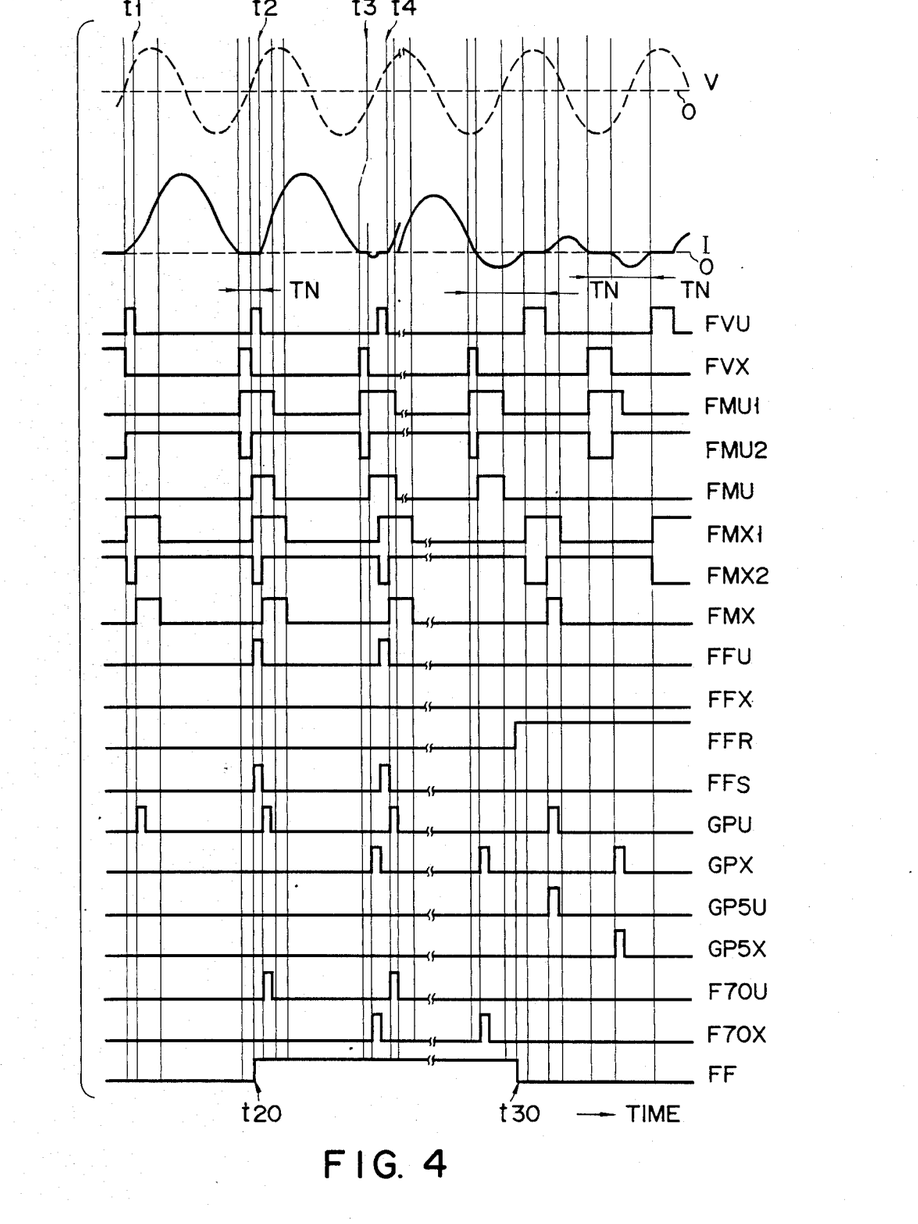
FIG. 4 is a timing chart for explaining an operation of a gate signal generator (voltage detector type) according to the embodiments of the present invention.

As shown in FIG. 4, when U-phase firing occurs near $\alpha=0°$ and time t1, U-phase set circuit (6U, 7U, 8) detects that U-phase OFF time interval (TN) is small and sets a flip-flop (10) (time t20). When a U-phase forward voltage is applied again at time t2, a gate signal (F70U) for firing the U-phase thyristor is generated in response to the output from the flip-flop, thus protecting the thyristor valves.

After time t2, U- and X-phase circuits generate gate signals (F70U, F70X) at the beginning of the forward voltage application (rising edges of FVU and FVX) and wait until the transient direct current component of the thyristor valve current is damped.

When the transient direct current component of the thyristor valve current is damped, the OFF time interval (TN) of the U-phase (=ON time interval of the X-phase) is increased. Therefore, an output (FFS) from the U-phase set circuit is not given. When the output (FFS) from the set circuit is not given for, e.g., one cycle of the power system frequency, and the thyristor valves can be safely turned off, i.e., at time t30, the flip-flop (10) is reset in response to an output (FFR) from the reset circuit. After time t30, the thyristor valves are fired upon only by normal gate circuit outputs (GP5U, GP5X), and the firing phases of the thyristor valves can be controlled again by an SVC controller.

DETAILED DESCRIPTION OF THE PREFERRED EMBODIMENTS

The present invention will be described below with reference to FIG. 5.

Figure 5:
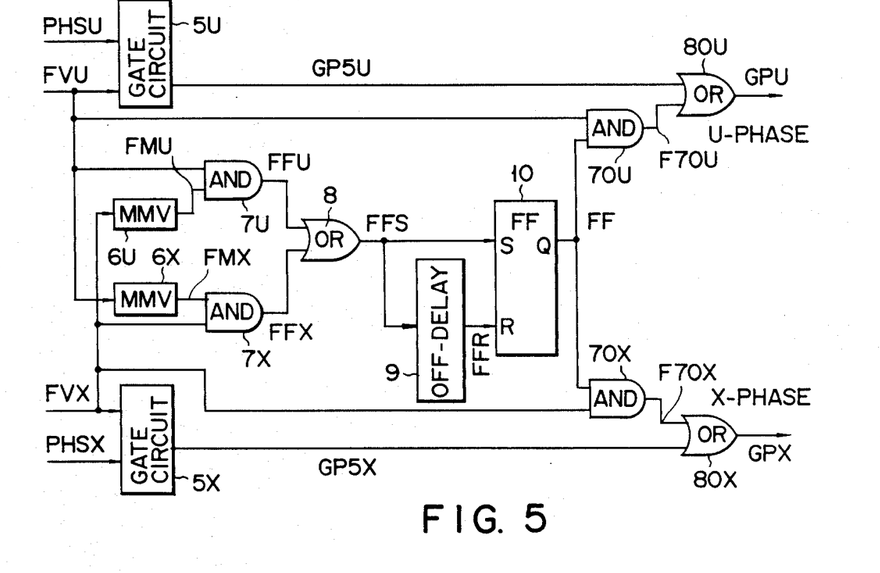
FIG. 5 is a circuit diagram showing a gate signal generator (voltage detector type) according to a first embodiment of the present invention.

Referring to FIG. 5, reference numerals 6U and 6X denote monostable multivibrators (one-shot pulse circuits); 7U and 7X, AND gates; 8, an OR gate; 9, an OFF-delay (or monostable multivibrator); and 10, a flip-flop.

A set circuit according to the present invention comprises monostable multivibrators 6U and 6X, AND gates 7U and 7X, and OR gate 8. A reset circuit comprises OFF-delay (or a retriggerable multivibrator) 9.

As shown in FIG. 4, OFF time interval TN of a U-phase of a thyristor valve is a time interval defined from a rising edge of X-phase forward voltage signal FVX to a falling edge of U-phase forward voltage signal FVU. The pulse widths of monostable multivibrators 6U and 6X are set to have, e.g., the length of the zero-voltage turn-off time of the thyristor valve (diode turn-off time on the order of msec) or greater. Therefore, when U-phase forward voltage signal FVU rises during the pulse width (about 1 msec), beginning from the falling edge of X-phase forward voltage signal FVX, of output FMU from monostable multivibrator 6U, U-phase set signal FFU serving as an output from AND gate 7U is set at a "1" level, and set signal FF serving as an output from OR gate 8 is set at a "1" level. The above manner can also be applied to the X-phase.

The delay time of OFF-delay 9 is set so as to only output "1" level when the input at the OFF-delay is kept at a "0" level, e.g., for one cyle of the power system frequency. Therefore, when set signal FF is kept at a "0" level for one cycle, i.e., when the thyristor valve can be safely turned off, flip-flop 10 is reest.

When flip-flop 10 is set and output signal FF is set at a "1" level, forward voltage signals FVX and FVU are caused to rise. More specifically, at the beginning of the forward voltage application (at t3 and t4 in FIG. 4), GPU and GPX are set at a "1" level through AND gates 70U and 80X and OR gates 80U and 80X, and the signals corresponding to "1" are applied to thyristor valves 3U amd 3X shown in FIG. 1 through an optical fiber or the like as optical gate signals, thus firing the thyristor valves.

When the flip-flop is reset and output signal FF is set at a "0" level, the thyristor valves are fired in response to signals GP5U and GP5X from only normal gate circuits 5U and 5X. Therefore, the firing phases of the thyristor valves can be again controlled. The timing of the signals in FIG. 5 is shown in FIG. 4. According to the present invention as described above, a gate signal generator for protecting the thyristor valves and returning to the prescribed phase control can be provided.

Figure 6:
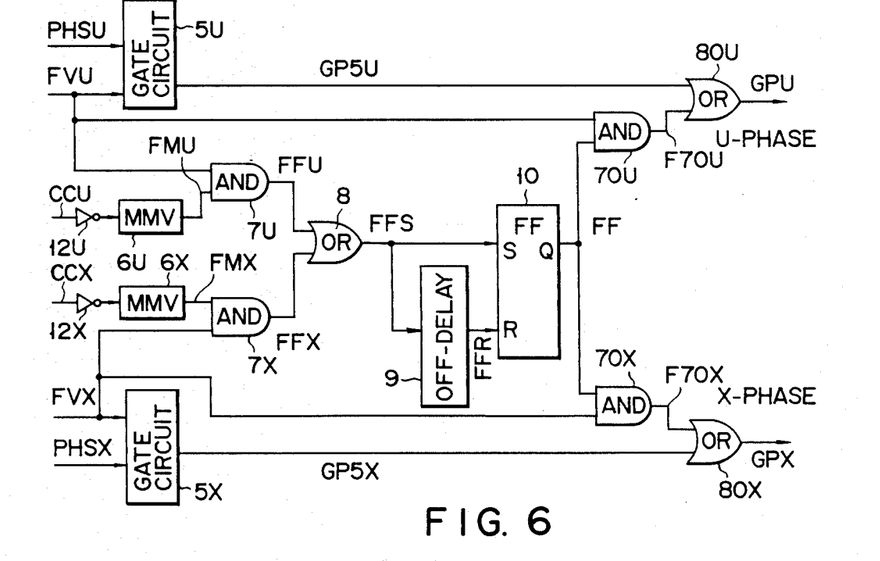
FIG. 6 is a circuit diagram showing a gate signal generator (current detector type) according to a second embodiment of the present invention.
Figure 9:
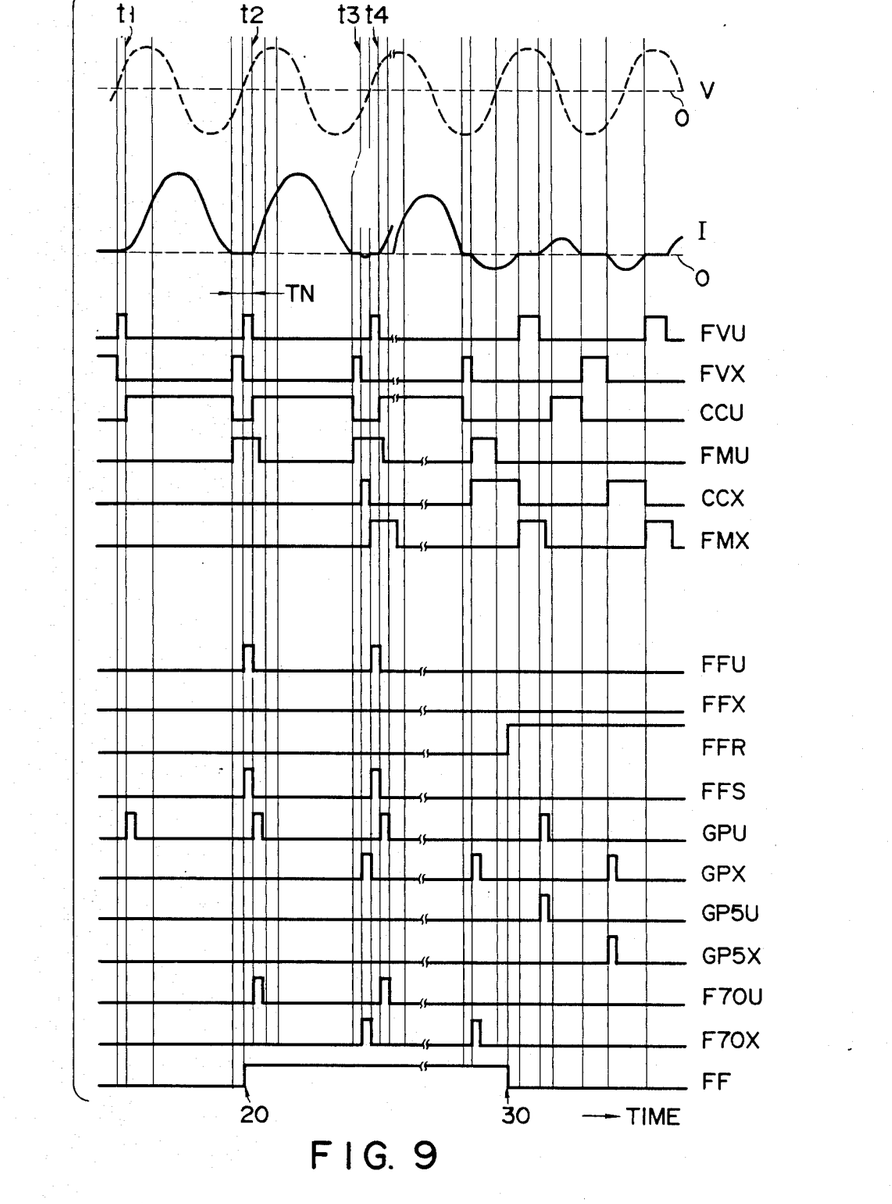
FIG. 9 is a timing chart for explaining an operation of a gate signal generator (current detector type) according to another embodiment of the present invention.

FIG. 6 is a circuit diagram showing an arrangement according to another embodiment of the present invention. In this embodiment, OFF time interval TN is detected in accordance with U- and X-phase current signals CCU and CCX serving as outputs from current detector 11 shown in FIG. 1 and inverter 12. The circuit arrangement in FIG. 6 is the same as that in FIG. 5 except that OFF time interval TN is not detected by a voltage signal, but rather, by a current signal. The timings of the signals in FIG. 6 are shown in FIG. 9.

Figure 7:
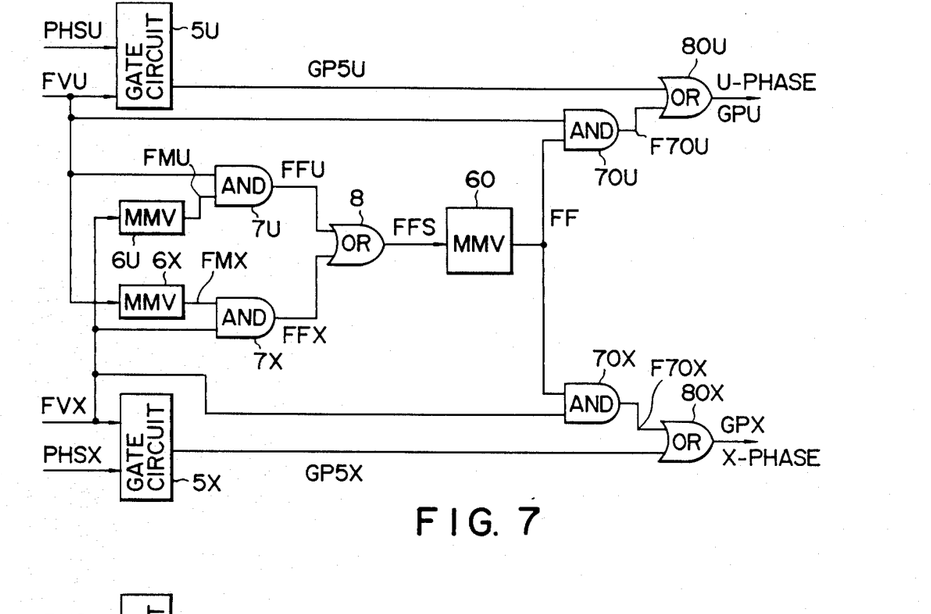
FIG. 7 is a circuit diagram showing a gate signal generator (voltage detector type) according to a third embodiment of the present invention.

FIG. 7 is a circuit diagram showing an arrangement according to still another embodiment of the present invention. In this embodiment, monostable multivibrator 60 is employed in place of the reset circuit and the flip-flop.

The pulse width (normally, msec order) of output FF from monostable multivibrator 60 can be determined in correspondence with the time constant of damping of the transient phenomenon determined by the resistive and reactive components of an electric power system including reactors and a voltage transformer.

An arrangement shown in FIG. 7 is the same as that in FIG. 5 except that differing methods (circuit arrangement) are used for determining when a phase control by normal gate circuits 5U and 5X is reset or resumed.

Figure 8:
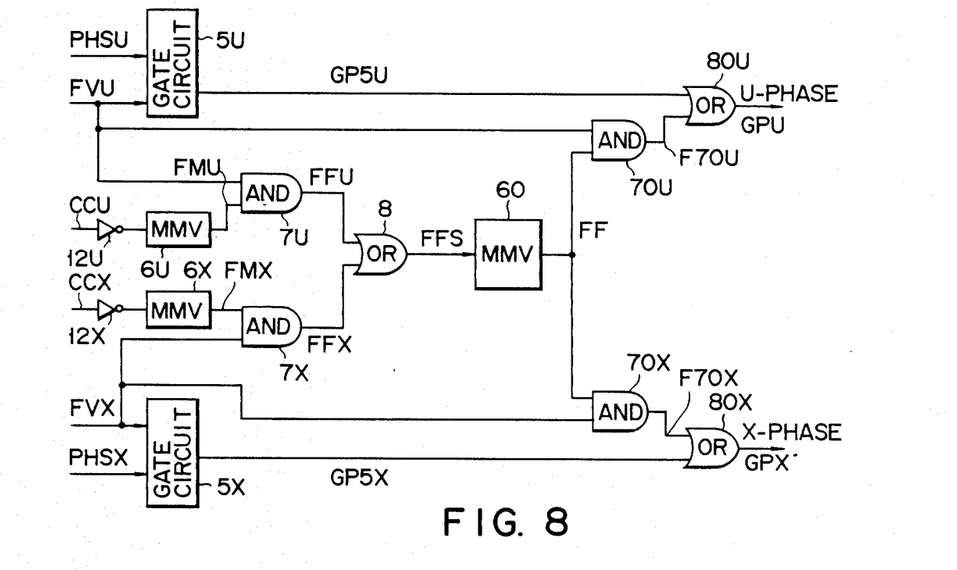
FIG. 8 is a circuit diagram showing a gate signal generator (current detector type) according to a fourth embodiment of the present invention.

An arrangement shown in FIG. 8 is the same as that in FIG. 3 except that OFF time interval TN is detected in accordance with current signals CCU and CCX, as shown in FIG. 7.

The gate signal generators of the embodiments shown in FIGS. 5 to 8 can be connected to the static var controller of FIG. 1. Output signals FVU and FVX from forward voltage detectors 4U and 4X are supplied to the gate signal generators shown in FIGS. 5 to 8, and gate signals therefrom are supplied to the gates of thyristors 3U and 3X shown in FIG. 1.

Figure 10:
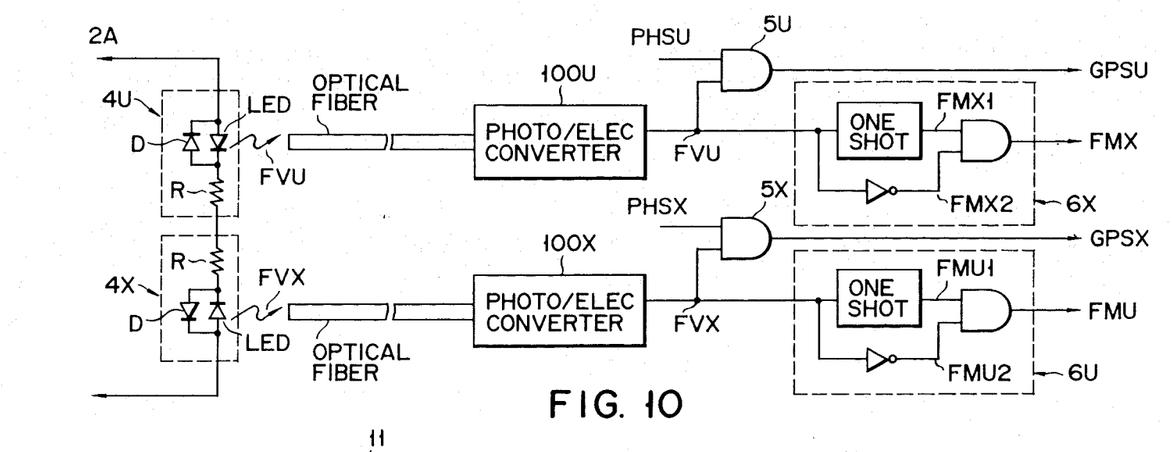
FIG. 10 is a circuit diagram showing a detailed arrangement of forward voltage detectors (4U, 4X) and gate circuits (5U, 5X) shown in FIG. 1, and monostable multivibrators (6U, 6X) shown in FIG. 5.

FIG. 10 shows a detailed arrangement of gate circuits 5U and 5X, and of forward voltage detector 4U and 4X shown in FIG. 1 and monostable multivibrators 6U and 6X shown in FIG. 5. Forward voltage detectors 4U and 4X each include reverse voltage protection diodes D, LEDs anti-parallel-connected to diode D, and current limitation resistors R connected in series with the LEDs, respectively.

The cathode side of the LED in forward voltage detector 4U is connected to the cathode side of the LED in forward voltage detector 4X. The anode side of the LED in forward voltage detector 4U is connected to the reactor 2A side, and the anode side of the LED in forward voltage detector 4X is connected to the reactor 2B side. This circuit connection enables the LED in forward voltage detector 4U to emit light during a half cycle of voltage V in which the reactor 2A side is positive, and enables the LED in forward voltage detector 4X to emit light during a half cycle of voltage V in which the reactor 2A side is negative.

Optical signal FVU obtained by light emitted from the LED in forward voltage detector 4U is applied to photo/electric converter 100U through an optical fiber and converted into electrical signal FVU. Similarly, optical signal FVX obtained by light emitted from the LED in forward voltage detector 4X is applied to photo/electric converter 100X through an optical fiber and converted into electrical signal FVX.

Note the signal transmission using the optical fiber described above is shown in European Patent Publication No. 0 225 618 A2.

Signal FVU is input to AND gate 5U with U-phase control signal PHSU, and output GP5U from AND gate 5U is supplied to OR gate 80U. Signal FVX is input to AND gate 5X with X-phase control signal PHSX, and output GP5X from AND gate 5X is supplied to OR gate 80X.

Signal FVU is converted into pulse FMX1 through a one-shot pulse circuit and is converted into pulse FMX2 through an inverter. A logical AND signal of pulses FMX1 and FMX2 is converted into signal FMX by an AND gate. Similarly, signal FVX is converted into pulse FMU1 through a one-shot pulse circuit and is converted into pulse FMU2 through an inverter. A logical AND signal of pulses FMU1 and FMU2 is converted into signal FMU by an AND gate.

Figure 11:
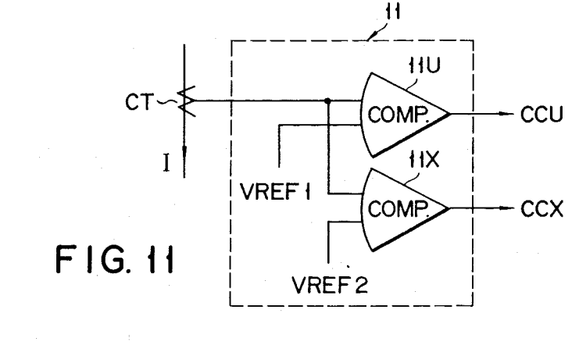
FIG. 11 is a circuit diagram showing a detailed arrangement of a current detector (11) shown in FIG. 1.
Figures 12A, 12B, 12C:
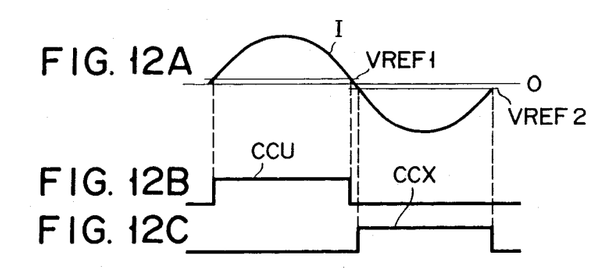
FIGS. 12A to 12C are waveform charts for explaining an operation of the current detector (11) shown in FIG. 11.

FIG. 11 shows a detailed arrangement of current detector 11 shown in FIG. 1. FIGS. 12A to 12C are waveform charts for explaoning an operation of current detector 11 shown in FIG. 11.

Current I of the thyristor valve detected by current transformer CT is input to comparators 11U and 11X. Comparison reference levels VREF1 and VREF2 are input to comparators 11U and 11X, respectively. As shown in FIGS. 12A to 12C, when current I is set at a positive level, i.e., the same level as comparison reference level VREF1 or more, comparator 11U generates current signal CCU. When current I is set at a negative level, i.e., the same level as comparison reference level VREF2 or less, comparator 11X generates current signal CCX. Current signals CCU and CCX are applied to monostable multivibrators 6U and 6X (FIG. 6 or 8) having the same circuit arrangement as that in FIG. 10.

According to the present invention as has been described above, when the turn-off time interval of the thyristor is small, the gate signals are output to the thyristor valves in both forward and reverse directions at the beginning of the forward voltage application and the thyristor valves are protected. After the turn-off time interval becomes sufficiently long, the firing phases of the thyristor valves can be effectively controlled again.

Note that the gate signal generator apparatus according to the present invention can be applied to the control of any switching elements which are incapable of turning themselves off.

When a series circuit of anti-parallel-connected thyristors and a reactor is considered as one unit of the thyristor valve employing the gate signal generator apparatus according to the present invention, three such units can be connected in a three-phase delta- (or Y-) fashion. (This arrangement is disclosed in, e.g., Japanese Patent Disclosure No. 60-204230.)

What is claimed is:

1. A gate signal generator apparatus for firing a switching element valve including one or more anti-parallel-connected switching element pairs connected in series and controlled by phase control signals, comprising:

first means, connected to the switching element pair, for detecting an OFF time interval defined as an interval from the end of a conduction period of the switching element pair to the beginning of forward voltage application thereto, and outputting a first signal when the detected OFF time interval is not greater than a first predetermined time interval;

second means, coupled to said OFF time interval detecting means, for outputting a second signal representing a second predetermined time interval after the first signal has been output;

third means, coupled to said first means and said second means, for outputting auxiliary gate pulses when the second signal is output and forward voltage signals are generated at the beginning of the forward voltage application to the switching element pair; and fourth means, coupled to said third means, for inserting the auxiliary gate pulses into the phase control signals for firing the switching element valve.

2. An apparatus according to claim 1, wherein the switching elements include thyristor elements which are incapable of turning themselves off, and the first predetermined time interval is set to be not smaller than a zero-voltage turn-off time of the thyristor elements.

3. An apparatus according to claim 1, wherein the second predetermined time interval is set to be not smaller than one cycle of a power system frequency.

4. An apparatus according to claim 1, wherein the second predetermined time is set to be not smaller than a time interval required for damping a direct current component of the current, flowing through the switching element valve, to be smaller enough.

5. An apparatus according to claim 4, further comprising reactors connected in series with the switching element pair.

6. An apparatus according to claim 1, wherein said first means includes:

first forward voltage detecting means for outputting a first forward voltage signal when the forward voltage is applied to one element of the switching element pair;

second forward voltage detecting means for outputting a second forward voltage signal when the forward voltage is applied to the other element of the switching element pair;

first delay means for delaying the second forward voltage signal by a time interval corresponding to the first predetermined time interval and outputting a first delay signal having a predetermined pulse width;

second delay means for delaying the first forward voltage signal by a time interval corresponding to the first predetermined time interval and outputting a second delay signal having a predetermined pulse width;

first logical means for calculating an AND product of the first forward voltage signal and the first delay signal and outputting a first AND signal;

second logical means for calculating an AND product of the second forward voltage signal and the second delay signal and outputting a second AND signal; and third logical means for calculating an OR sum of the first AND signal and the second AND signal and outputting the first signal.

7. An apparatus according to claim 1, wherein said first means includes:

first current detecting means for outputting a first current signal when a current flows through one element of the switching element pair;

second current detecting means for outputting a second current signal when a current flows through the other element of the switching element pair;

first delay means for delaying the first current signal by a time corresponding to the first predetermined time interval and outputting a first delay signal having a predetermined pulse width;

second delay means for delaying the second current signal by a time interval corresponding to the predetermined time interval and outputting a second delay signal having a predetermined pulse width;

first logical means for calculating and AND product of the first forward voltage signal and the first delay signal and outputting a first AND signal;

second logical means for calculating an AND product of the second forward voltage signal and the second delay signal and outputting a second AND signal; and third logical means for calculating an OR sum of the first AND signal and the second AND signal and outputting the first signal.

8. An apparatus according to claim 1, wherein said second means includes:

flip-flop means, set in response to the first signal, for maintaining the setting state when the first signal is repeatedly generated during a predetermined time interval corresponding to the second predetermined time interval, and reset when the first signal is not present during a time interval which is not less than the predetermined time interval corresponding to the second predetermined time interval, for outputting the second signal.

9. An apparatus according to claim 1, wherein said second means includes:

multivibrator means, triggered in response to the first signal, for outputting the second signal during a predetermined time interval corresponding to the second predetermined time interval.

* * * * *